United States Patent
Hsu et al.

(10) Patent No.: US 6,696,227 B2
(45) Date of Patent: Feb. 24, 2004

(54) SHIFT MULTI-EXPOSURE METHOD

(75) Inventors: Chung-Wei Hsu, Taipei (TW); Ron-Fu Chu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 83 days.

(21) Appl. No.: 10/016,893

(22) Filed: Dec. 13, 2001

(65) Prior Publication Data
US 2002/0119402 A1 Aug. 29, 2002

(30) Foreign Application Priority Data
Feb. 26, 2001 (TW) .................................. 90104353 A

(51) Int. Cl.[7] ................................................ G03F 7/20
(52) U.S. Cl. .................... 430/322; 430/394; 430/396
(58) Field of Search ................................ 430/311, 313, 430/322, 22, 394, 396

(56) References Cited

U.S. PATENT DOCUMENTS 6,187,486 B1 * 2/2001 Lai .............................. 430/22

* cited by examiner

*Primary Examiner*—Kathleen Duda
(74) *Attorney, Agent, or Firm*—Ladas & Parry

(57) ABSTRACT

The present invention provides a shift multi-exposure method for defining a regular pattern by a photomask. The method comprises the following steps. First, a photoresist layer comprising a first region and a second region is formed on a substrate. Then, a first pattern is defined on the first region by the photomask. Next, the photomask is moved a predetermined distance, and a second pattern is defined on the second region by the photomask. Finally, development is performed to display the first pattern and the second pattern on the photoresist layer.

4 Claims, 3 Drawing Sheets

SHIFT MULTI-EXPOSURE METHOD

BACKGROUND OF THE INVENTION

1. Field of the Invention

The present invention relates in general to an exposure method using photomask shifting. In particular, the present invention relates to an exposure method to define two adjacent patterns in which adjacent and same patterns are transferred by a plurality of exposures with a single photomask. Therefore, the distorteded appearance of adjacent patterns due to proximity of transparent regions in a photomask is avoided.

2. Description of the Related Art

In semiconductor production, the process for transferring a photomask pattern to a resist material on a semiconductor wafer is referred to as the photolithographic process.

In recent years, along with the increasing miniaturization of the semiconductor devices produced, design rule has become smaller and lithography is being performed near the theoretical lower limit of resolution. This trend propagates the disadvantages of deterioration in performance of semiconductor devices due to deformation of the transfer pattern and reduction of yield due to bridging (error connection) and disconnection of the patterns.

FIG. 1 depicts transparent regions located on a photomask. The photomask 11 comprises a plurality of transparent regions (121–126). As shown in FIG. 1, the distance X between transparent regions 121 and 122 is much shorter than the distance Y between transparent regions 124 and 125. Therefore, the patterns transferred by the transparent regions 121 and 122 are distorted. Due to the image distortion, the original design may not be printed exactly.

The formation of photomask 11 is usually applied to an integrated circuit with regular design, such as DRAM circuits. To eliminate the optical error, better optical lens and process control are required. However, this is very difficult and costly.

SUMMARY OF THE INVENTION

The present invention provides an exposure method to define two adjacent patterns. In the present invention, adjacent and identical pattern groups are transferred by a plurality of exposures with a single photomask. Therefore, the distorteded appearance of adjacent patterns due to the proximity of transparent regions of a photomask is avoided. In addition, the elements of the pattern group are dependent upon the design pattern. Therefore, patterns with short distances will be printed exactly. In addition, the single photomask is used several times, so the cost of the process is not increased. Moreover, the process of exposure only entails shifting the photomask, and is thus a simple process.

To achieve the above-mentioned object, the present invention provides a shifting multi-exposure method for defining a regular pattern by a photomask. The method comprises the following steps. First, a photoresist layer comprising a first region and a second region is formed on a substrate. Then, a first pattern is defined on the first region by the photomask. Next, the photomask is moved for a predetermined distance, and then a second pattern is defined on the second region by the photomask. Finally, development is performed to display the first pattern and the second pattern on the photoresist layer.

Moreover, the present invention provides a shift multi-exposure method for defining a regular pattern by a photomask. The method comprises the following steps. First, a photoresist layer comprising a first region and a second region is formed on a substrate. Then, a pattern element is defined on the first region by the photomask. Next, the photomask is moved for a predetermined distance, and the pattern element is defined again on the second region by the photomask. Finally, development is performed to display the pattern elements on the photoresist layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 1:
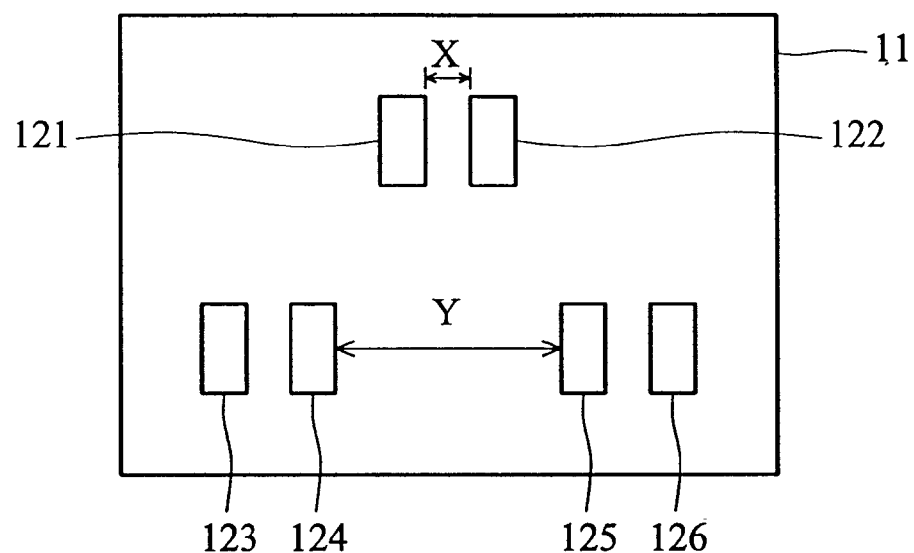
FIG. 1 depicts transparent regions located on a photomask.
Figure 2:
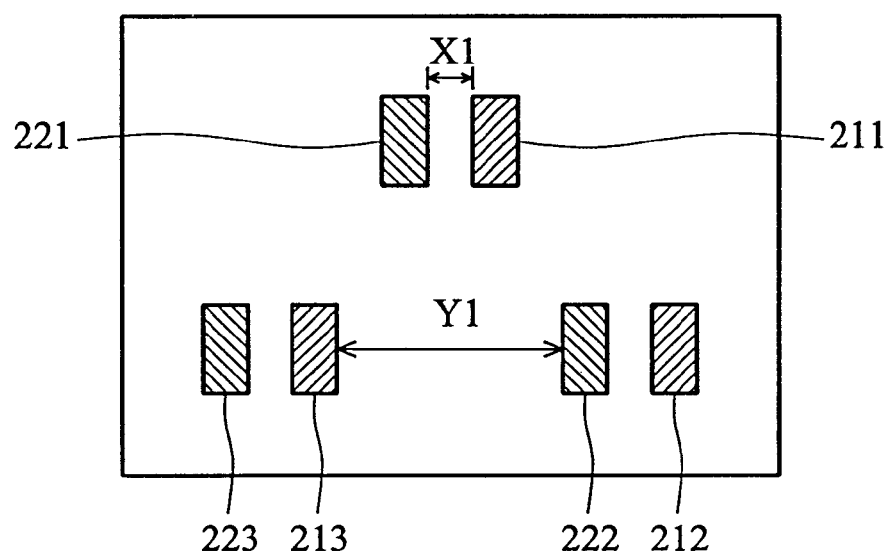
FIG. 2 depicts the patterns to be printed in the embodiment of the present invention.

FIG. 2 depicts the patterns to be printed in the embodiment of the present invention. There are two group of patterns in FIG. 2. The first group of patterns comprises pattern elements 211–213, and the second group of patterns comprises pattern elements 221–223.

In FIG. 2, the first group of patterns and the second group of patterns are very close to each other, such as pattern element 211 and pattern element 221. In addition, the distance X1 between pattern element 213 and 222 is much longer than the distance Y1 between pattern element 211 and 221. Therefore, if the first group of patterns and the second group of patterns are printed together by the conventional method, due to image distortion, the original design may not be printed exactly.

Therefore, according to the characteristic of the regularity of the first group of patterns and the second group of patterns, the present invention prints the first group of patterns and the second group of patterns by a shifting multi-exposure method. The flow of the shift multi-exposure method according to the present invention is described as below.

Figure 3:
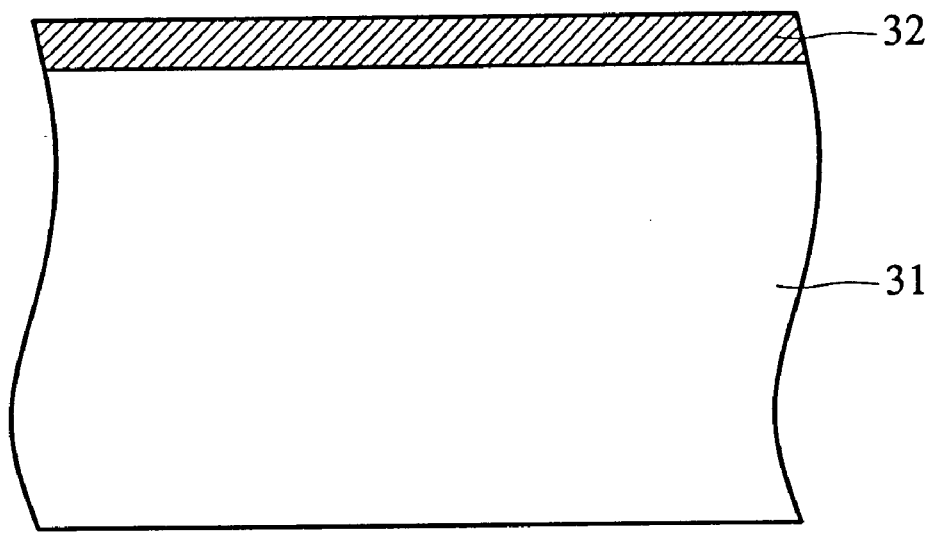
FIG. 3 is a diagram showing the configuration of the present embodiment.
Figure 4A:
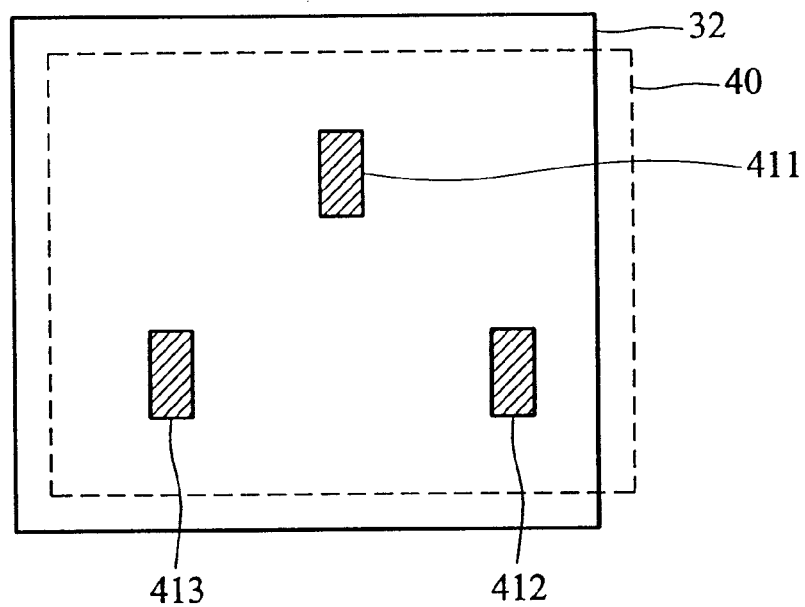
FIGS. 4A and 4B are diagrams showing patterns printed by a photomask according to the shift multi-exposure method of the present invention.
Figure 4B:
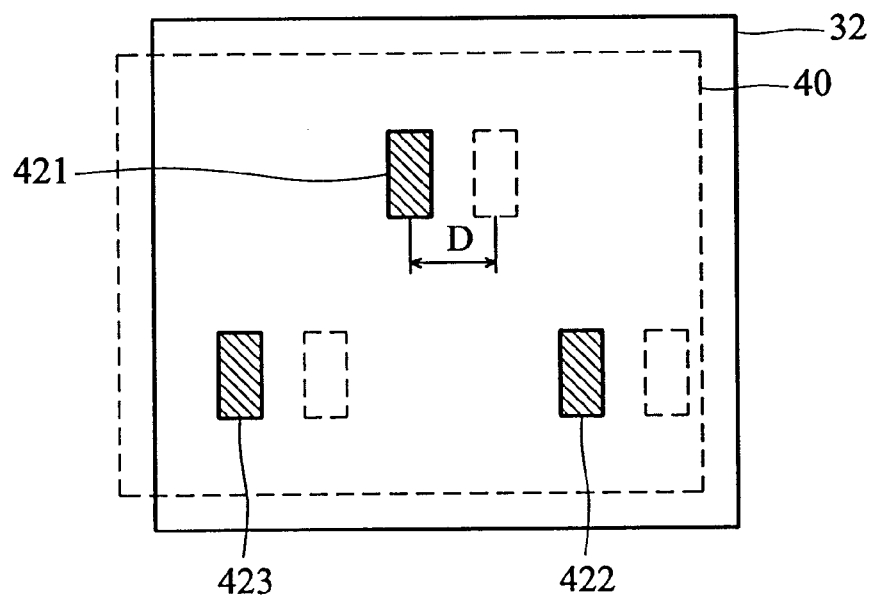

FIG. 3 is a diagram showing the configuration of the present embodiment. FIGS. 4A and 4B are diagrams showing patterns are printed by a photomask according to the shift multi-exposure method of the present invention.

In FIG. 3, a substrate 31 is provided. The surface or inside of the substrate 31 may comprise some structures, such as wells or oxide layers. FIG. 3 shows only a substrate comprising a flat surface to simplify illustration. Next, a photoresist 32, comprising a first region and a second region is formed on the substrate 31. Here, the first region corresponds to the region comprising patterns 411–413 in FIG. 4A, and the second region corresponds to the region comprising patterns 421–423 in FIG. 4B. Next, patterns 411–413 are defined on the first region of the photoresist 32 by photomask 40. Next, the photomask 40 is shifted with a predetermined distance D, then patterns 421–423 are defined on the second region of the photomask 40 by the photomask 40. In the present invention, the range of the predetermined distance D is between 20 nm and 30 nm, because diffraction is pronounced in this range. Finally, patterns 411–413 and patterns 421–423 are developed on the photoresist 32. Therefore, the photoresist 32 comprises the regular patterns as shown in FIG. 2.

In the present invention, the patterns 411–413 and patterns 421–423 may be took as a pattern group, because their configurations are the same. According to the embodiment of the present invention, the pattern group is defined according to the design of patterns, which is not limited to the numbers of the pattern elements comprised in a pattern group. The amount of regular pattern elements comprised in a pattern group is very large, as in DRAM circuit structure. Thus, the numbers of the regular pattern elements comprised in a pattern group should not limit the scope of the present invention.

Accordingly, the exposure method provided by the present invention is such that adjacent and identical pattern groups are transferred by a plurality of exposures with a single photomask. Therefore, the distorted appearance of adjacent patterns due to closing transparent regions of a photomask is avoided. In addition, the elements of the pattern group are dependent upon the design pattern. Therefore, patterns a short distance apart will be printed exactly. In addition, the single photomask is used several times, mass production is feasible for current exposure tools, there is no requirement for high quality expensive systems for image printing, so cost and process complexity are reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A shift multiexposure method for defining a regular pattern by a photomask, the method comprising the following steps:

providing a substrate;

forming a photoresist layer on the substrate, wherein the photoresist layer comprises a first region and a second region;

defining a first pattern on the first region by a photomask;

shifting the photomask a predetermined distance, then defining a second pattern on the second region by the photomask, wherein the predetermined distance is less than half of the wavelength of the exposure; and performing development to display the first pattern and the second pattern on the photoresist layer, wherein the regular pattern is composed by the first pattern and the second pattern.

2. The shift multi-exposure method as claimed in claim 1, wherein the predetermined distance is between about from 20 nm to 30 nm.

3. A shift multi-exposure method for defining a pattern element by a photomask, the method comprising the following steps:

providing a substrate;

forming a photoresist layer on the substrate, wherein the photoresist layer comprises a first region and a second region;

defining the pattern element on the first region by the photomask;

shifting the photomask a predetermined distance, then defining the pattern element on the second region by the photomask, wherein the predetermined distance is less than half the wavelength of the exposure; and performing development to display the pattern elements on the photoresist layer, then photoresist layer comprising regular pattern elements.

4. The shift multi-exposure method as claimed in claim 3, wherein the predetermined distance is between about from 20 nm to 30 nm.

\* \* \* \* \*